(12) United States Patent
Arione et al.

(10) Patent No.: US 8,310,839 B2
(45) Date of Patent: Nov. 13, 2012

(54) CAPACITIVE TOUCH SWITCH AND DOMESTIC APPLIANCE PROVIDED WITH SUCH SWITCH

(75) Inventors: Ettore Arione, Leggiuno (IT); Giuseppe Arena, Messina (IT); Roberto Lazzarotto, Castronno (IT)

(73) Assignee: Whirlpool Corporation, Benton Harbor, MI (US)

( * ) Notice: Subject to any disclaimer, the term of this patent is extended or adjusted under 35 U.S.C. 154(b) by 802 days.

(21) Appl. No.: 12/247,309

(22) Filed: Oct. 8, 2008

(65) Prior Publication Data
US 2009/0091906 A1 Apr. 9, 2009

(30) Foreign Application Priority Data

Oct. 8, 2007 (EP) .................................... 07118017

(51) Int. Cl.
*H05K 7/02* (2006.01)
*H05K 7/06* (2006.01)
*H05K 7/08* (2006.01)
*H05K 7/10* (2006.01)

(52) U.S. Cl. ........ 361/781; 361/782; 200/512; 200/514; 200/600

(58) Field of Classification Search .......... 200/300–314, 200/512–514, 600; 361/780–782
See application file for complete search history.

(56) References Cited

U.S. PATENT DOCUMENTS

| 4,304,976 | A | * | 12/1981 | Gottbreht et al. | ............. 219/702 |
| 5,239,152 | A | * | 8/1993 | Caldwell et al. | ............. 200/600 |
| 7,085,036 | B2 | * | 8/2006 | Otake et al. | .................... 359/318 |
| 7,895,968 | B2 | * | 3/2011 | Miura | .......................... 118/668 |
| 2006/0243575 | A1 | | 11/2006 | Cenedese | |
| 2007/0180869 | A1 | * | 8/2007 | Geyer | ............................ 68/196 |

* cited by examiner

*Primary Examiner* — Tuan T Dinh
(74) *Attorney, Agent, or Firm* — Jason S. Burnette; Diederiks & Whitelaw PLC

(57) ABSTRACT

A capacitive touch switch having a printed circuit board and a capacitive electrode connected to the circuit board is disclosed. The printed circuit board is transparent and is interposed between a planar light guide provided with a light source and a non-conductive transparent cover, the electrode being icon-shaped and supported by the printed circuit board.

10 Claims, 1 Drawing Sheet

CAPACITIVE TOUCH SWITCH AND DOMESTIC APPLIANCE PROVIDED WITH SUCH SWITCH

BACKGROUND OF THE INVENTION

1. Field of the Invention

The present invention relates to a capacitive touch switch to be used on control panels of domestic appliances or the like. The invention also refers to a capacitive touch switch comprising a control board and capacitive detecting means connected to the control board.

2. Description of the Related Art

With the term "switch" we mean every kind of touch sensors which usually replace the traditional buttons in modern flush user interfaces.

Visual feedback activation of a touch switch control is simply provided by a light source, for example a light emitted diode (LED). Usually several touch switches are arranged, together with control board thereof, in a control panel.

To avoid optical interference between adjacent touch switches, light flux shall be conveyed from a light source to the related touch sensitive switch surfaces.

Opaque walls or light guide means are normally provided for this object. The use of opaque walls increases physical dimensions and renders the mounting quite complex.

Light guides can be used as mechanical support for the electrodes. Electrodes can also be made of transparent conductive material (such as indium tin oxide), located between the light guide and the lower surface of the transparent cover under which the touch switch is placed, with an increase of the overall cost of the control panel.

On top of the above illumination problems, there is the need of assuring a good mechanical connection between the touch switch and the transparent cover (usually a glass or plastic plate) under which the switch is placed. Up to now, for assuring such mechanical contact springs or conductive rubber elements have been used, which increase the overall cost and complexity of the single touch switch.

Moreover technical solutions are known (for instance from US-A-2006/0243575) in which a support member, carrying electronic components, is separated from the transparent cover by a series of opaque septum-like partitions for creating physically delimited illumination channels. Even if such solution does not require light guides (light emitting diodes are placed on the support member directly), nevertheless it is quite bulky and of complex manufacturing.

SUMMARY OF THE INVENTION

It is an aspect of the present invention to propose a different structural arrangement of a touch switch with a somehow embedded light guide, in order to allow a reduction of physical dimensions of the switch, easy mounting process, and improvement on versatility for different symbols as painted objects.

Another aspect of the present invention is to provide a touch switch that has an improved sensibility.

A further aspect of the present invention is to provide a capacitive touch switch without an external icon serigraphy and which, when not activated or not in use (when the control panel is off) is not visible by the user.

A further aspect of the present invention is to provide a touch switch that can give a direct feedback to the user when a command has been duly received.

A further aspect of the present invention is to provide a touch switch that is substantially invisible by the user, its presence being detected only when the user's finger touches an enabling switch.

These and further aspects are obtained thanks to the features listed in the appended claims.

The capacitive touch switch according to the present invention is adapted to be used in association with a glass ceramic surface used in cooking appliances. Due to its limited thickness, the touch switch according to the invention does not increase the overall thickness of glass ceramic cooking hobs.

Moreover, it is adapted to be used on glass door for domestic ovens where the user interface is integrated in the door itself (and not on a "fixed" user interface usually above the door, as in traditional ovens). This allows the designer to get a very clean and modern design, where the "buttons" are substantially invisible up to when the user decides to switch on the appliance.

Another aspect of the present invention is a cost reduction for the icon serigraphy that is used for informing the user what is the specific function of the single touch switch.

BRIEF DESCRIPTION OF THE DRAWINGS

Further features and advantages of the present invention will be clearer from the following description given by way of non-limiting example, with reference to the accompanying drawings in which.

DETAILED DESCRIPTION OF THE PREFERRED EMBODIMENTS

Figure 1:
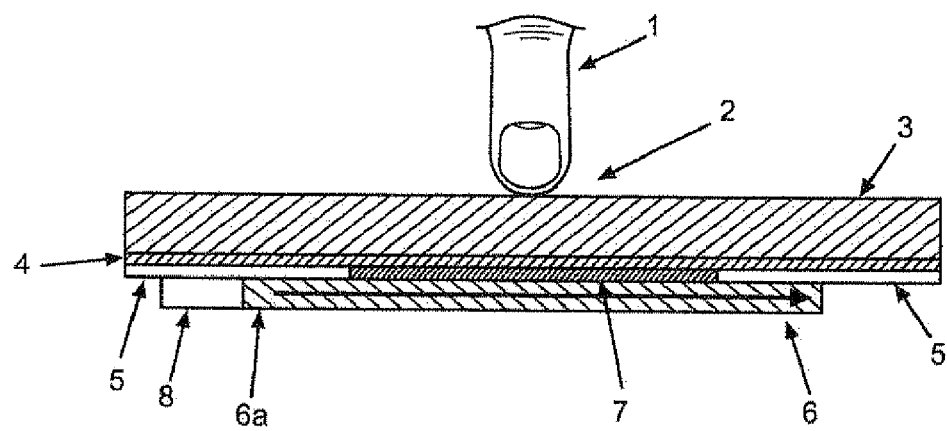
FIG. 1 shows a cross section of the touch switch according to the invention.
Figure 2A:
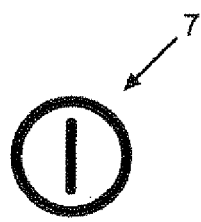
FIGS. 2a and 2b show examples of icons used in the touch switch of FIG. 1.
Figure 2B:
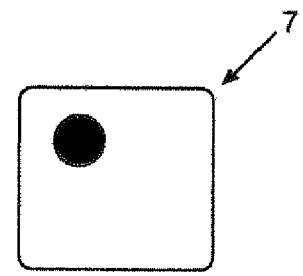
Figure 3:
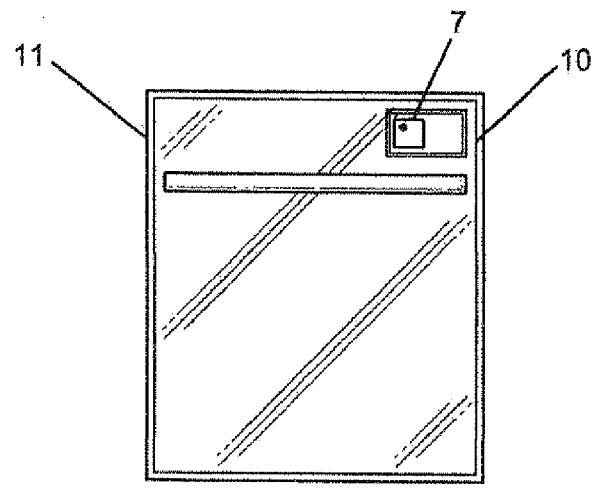
FIG. 3 shows a domestic appliance including a capacitive touch switch of the present invention.

With reference to the drawing, a capacitive touch switch according to the invention comprises a non-conductive transparent cover 3, made for instance of glass or plastic having a touch sensitive area 2 where the user's finger 1 may touch it. Under the transparent cover 3, by means of a non-conductive transparent adhesive 4, a transparent printed circuit board 5 is attached, on which an opaque icon-shaped electrode 7 is placed. The icon-shaped electrode 7, made for instance of copper, has a dimension sufficient to allow the capacitive effect of the touch switch, and it is directly connected to the rest of the electronic circuit supported by the printed circuit board 5. The icon-shaped electrode 7 may have whatever shape related to the different function or parameter that the user can choose by touching the switch. In FIG. 2a the icon-shaped electrode 7 has the typical shape of an on/off button, while in FIG. 2b the shape of the electrode 7 has the object to indicate a specific selection of a heater on a cooktop. In one embodiment, the capacitive touch switch is supported on a hinged, transparent oven door 10 attached to a domestic appliance 11, such as a cooking appliance or the like, as depicted in FIG. 3.

Under the transparent printed circuit board 5 a planar light guide 6 is placed having an edge 6a where a light emitting diode (LED) 8 is placed for conveying light to the light guide 6. The LED 8 is directly connected to the electronic circuit of the printed circuit board 5.

From the above description it is clear that the touch switch according to the invention allow a cost reduction for the icon serigraphy, which is somehow "embedded" in the single side printed circuit board. Moreover there is a cost saving of transparent material and electrode assembly, for instance compared to a traditional ITO solution.

A dark effect on the surface of the control panel can be obtained when the single switch or the whole control panel is off. There is no need of using transparent electrodes, springs, conductive rubber pieces and holes in the printed circuit board. The LED may have three different conditions of illumination level, i.e. a first "off" level when the switch and/or the overall control board is switched off, a second intermediate level in which the touch switch, or better the icon thereof, can be seen by the user but the touch switch is inactive (even if touched by the user, there is no effect on the appliance), and a third high level in which the icon is illuminated at the highest level in order to inform the user that the specific touch switch is active and can be used. A different level of illumination may be used for providing the user with an immediate feedback in order to inform him that the function or parameter has been selected correctly.

We claim:

1. A capacitive touch switch comprising:
   a printed circuit board; and
   capacitive detector having an icon-shaped electrode supported by the printed circuit board and connected to the circuit board, wherein the printed circuit board is transparent and is interposed between a planar light guide: provided with a light source and a non-conductive transparent cover such that the icon-shaped electrode is visible to a user when the light source is actuated;
   wherein the capacitive touch switch is placed on a cooking appliance; and
   further comprising, in combination, an oven having a transparent door attached to structure of the oven, wherein a user interface with the capacitive touch switch is mounted on the door.

2. The capacitive touch switch according to claim 1, wherein the transparent printed circuit board is of the indium-tin-oxide (ITO) type.

3. The capacitive touch switch according to claim 1, wherein a non-conductive layer of transparent adhesive is interposed between the non-conductive transparent cover and the transparent printed circuit board.

4. The capacitive touch switch according to claim 1, wherein the light source is a light emitting diode connected to the printed circuit board and mounted on an edge of the light guide.

5. A domestic appliance comprising:
   an appliance body; and
   capacitive touch switch including:
   a printed circuit board; and
   capacitive detector having an icon-shaped electrode supported by the printed circuit board and connected to the circuit board, wherein the printed circuit board is transparent and interposed between a planar light guide provided with a light source and a non-conductive transparent cover such that the icon-shaped electrode is visible to a user when the light source is actuated; and
   further comprising: a transparent door attached to the appliance body, wherein the capacitive touch switch is located on the door.

6. The domestic appliance according to claim 5, wherein the transparent printed circuit board is of the indium-tin-oxide (ITO) type.

7. The domestic appliance according to claim 5, wherein a non-conductive layer of transparent adhesive is interposed between the non-conductive transparent cover and the transparent printed circuit board.

8. The domestic appliance according to claim 6, wherein domestic appliance is a cooking appliance.

9. A domestic appliance comprising:
   an appliance body; and
   a capacitive touch switch including:
   a printed circuit board; and
   capacitive detector having an icon-shaped electrode supported by the printed circuit board and connected to the circuit board, wherein the printed circuit board is transparent and interposed between a planar light guide provided with a light source and a non-conductive transparent cover such that the icon-shaped electrode is visible to a user when the light source is actuated, wherein the light source is a light emitting diode connected to the printed circuit board and mounted on an edge of the light guide; and
   a door attached to the appliance body, wherein the capacitive touch switch is located on the door.

10. The domestic appliance according to claim 9, wherein the door is transparent.

* * * * *